(12) United States Patent
Shkolnikov et al.

(10) Patent No.: US 12,025,549 B2
(45) Date of Patent: Jul. 2, 2024

(54) CELL ANALYZERS

(71) Applicant: Hewlett-Packard Development Company, L.P., Spring, TX (US)

(72) Inventors: Viktor Shkolnikov, Palo Alto, CA (US); Alexander Govyadinov, Corvallis, OR (US); Diane R. Hammerstad, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 417 days.

(21) Appl. No.: 17/414,155

(22) PCT Filed: May 13, 2019

(86) PCT No.: PCT/US2019/032008
§ 371 (c)(1),
(2) Date: Jun. 15, 2021

(87) PCT Pub. No.: WO2020/231399
PCT Pub. Date: Nov. 19, 2020

(65) Prior Publication Data
US 2022/0080421 A1   Mar. 17, 2022

(51) Int. Cl.
| | |
|---|---|
| *G01N 15/12* | (2024.01) |
| *B01L 3/00* | (2006.01) |
| *B81B 7/02* | (2006.01) |
| *G01N 15/10* | (2024.01) |
| *G01N 15/1031* | (2024.01) |
| *G01N 33/543* | (2006.01) |

(52) U.S. Cl.
CPC ........ *G01N 15/12* (2013.01); *B01L 3/502761* (2013.01); *B81B 7/02* (2013.01);
(Continued)

(58) Field of Classification Search
CPC .............. G01N 15/12; G01N 15/1031; G01N 33/54386; G01N 2015/1006;
(Continued)

(56) References Cited

U.S. PATENT DOCUMENTS

| | | | |
|---|---|---|---|
| 9,096,823 | B1 | 8/2015 | Branch et al. |
| 2009/0093728 | A1 | 4/2009 | Hyde et al. |

(Continued)

FOREIGN PATENT DOCUMENTS

| | | |
|---|---|---|
| CN | 101028525 B | 12/2010 |
| DE | 3215719 A1 | 11/1983 |

(Continued)

*Primary Examiner* — Amy He
(74) *Attorney, Agent, or Firm* — Foley & Lardner LLP (57) ABSTRACT

A system includes a microchannel analysis region, a first fluid actuation device, a second fluid actuation device, a sensor, and a controller. The first fluid actuation device is at a first end of the microchannel analysis region. The second fluid actuation device is at a second end of the microchannel analysis region opposite to the first end. The sensor is within the microchannel analysis region between the first fluid actuation device and the second fluid actuation device. The sensor measures an impedance of a fluid within the microchannel analysis region. The controller activates the first fluid actuation device to generate a first pressure wave in the fluid and activates the second fluid actuation device to generate a second pressure wave in the fluid. The first pressure wave and the second pressure wave converge at the sensor.

15 Claims, 11 Drawing Sheets

(52) U.S. Cl.
CPC ..... *G01N 15/1023* (2024.01); *G01N 15/1031* (2013.01); *G01N 33/54386* (2013.01); *B01L 2200/025* (2013.01); *B01L 2200/0652* (2013.01); *B01L 2200/0663* (2013.01); *B01L 2300/0645* (2013.01); *B01L 2300/0663* (2013.01); *B01L 2300/0829* (2013.01); *B01L 2300/14* (2013.01); *B01L 2400/02* (2013.01); *B01L 2400/0487* (2013.01); *G01N 2015/1006* (2013.01); *G01N 2015/1028* (2024.01)

(58) Field of Classification Search
CPC ....... G01N 2015/1028; B01L 3/502761; B01L 2200/0652; B01L 2300/0645; B01L 2300/0829; B01L 2300/14
See application file for complete search history.

(56) References Cited

U.S. PATENT DOCUMENTS

| | | |
|---|---|---|
| 2014/0128285 A1 | 5/2014 | Rowat et al. |
| 2016/0008811 A1 | 1/2016 | Laser et al. |
| 2016/0016013 A1 | 1/2016 | Capelli et al. |
| 2016/0231223 A1 | 8/2016 | Wang et al. |
| 2018/0119215 A1 | 5/2018 | Esfandyarpour et al. |
| 2018/0235508 A1 | 8/2018 | Cosentino et al. |
| 2018/0266937 A1* | 9/2018 | de Wagenaar .... B01L 3/502761 |
| 2018/0296114 A1 | 10/2018 | Welsh et al. |

FOREIGN PATENT DOCUMENTS

| | | |
|---|---|---|
| EP | 3418721 A1 * | 12/2018 |
| WO | WO-2005083423 A2 | 9/2005 |

* cited by examiner

CELL ANALYZERS

BACKGROUND

The mechanical properties of a cell are related to the biological behavior of the cell. For example, elasticity of circulating tumor cells is strongly correlated to their metastatic potential, where more elastic cells have a higher metastatic potential. This may be due to the ability of these cells to pass through and thus infiltrate tissues.

BRIEF DESCRIPTION OF THE DRAWINGS

FIGS. 2A-4B illustrate one example of a cell analyzer in operation.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

Accurate measurement of cell mechanical deformability properties, such as on the single cell level, is useful for basic biological research as well as for diagnostic purposes, for isolation of particular cell populations of interest. In addition, basic biological studies and clinical applications seek to determine both the full non-linear stress-strain response of the cell and the visco-elastic properties (e.g., complex elastic moduli) of the cell. The stress-strain response and the visco-elastic properties assist in predicting the cell migration through tissues, the cell potential for wound healing (e.g., tissue reconfiguration), the cell's metastatic potential, and other biomechanical cell behaviors.

Accordingly, disclosed herein is a compact, integrated microfluidic system compatible with integration into point-of-care instruments to perform mechanical cell deformation analysis and sorting. The cell deformation analyzer (e.g., a mechanical phenotyper) includes two fluid actuation devices on opposite sides of a sensing location to generate pressure waves within a fluid that deform a cell to be analyzed at the sensing location. The impedance of the fluid at the sensing location is measured using a sensor and the deformation of the cell is determined based on the measured impedance. The deformation of the cell may be used to sort the cell in real time.

Figure 1:
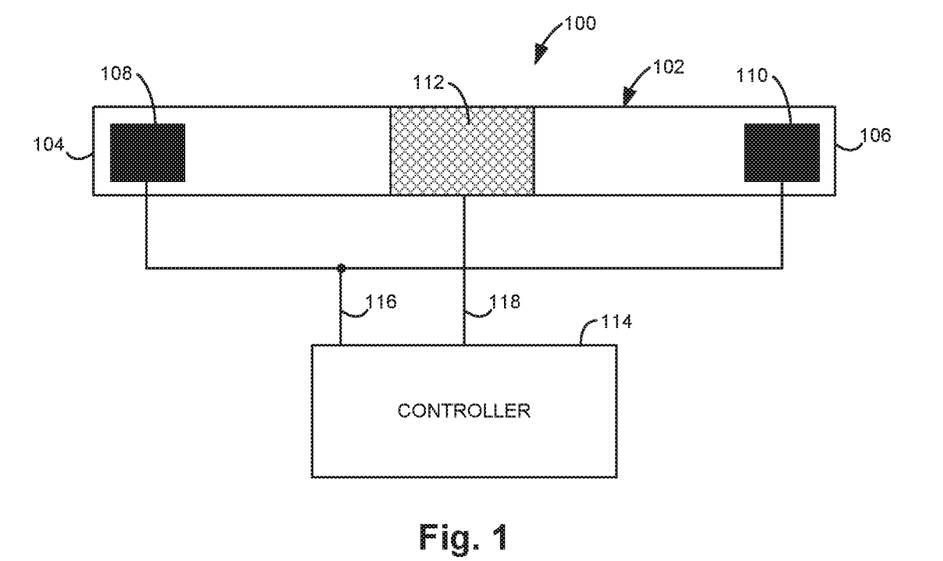
FIG. 1 illustrates one example of a cell analyzer.

FIG. 1 illustrates one example of a cell analyzer 100. Cell analyzer 100 includes a microchannel analysis region 102, a first fluid actuation device 108, a second fluid actuation device 110, a sensor 112, and a controller 114. The first fluid actuation device 108 is at a first end 104 of the microchannel analysis region 102. The second fluid actuation device 110 is at a second end 106 of the microchannel analysis region 102 opposite to the first end 104. The first fluid actuation device 108 and the second fluid actuation device 110 may include a thermal inkjet resistor (e.g., to generate a drive bubble), a piezoelectric device, a magnetostrictive element, or another suitable pump (e.g., an integrated inertial pump).

The sensor 112 is within the microchannel analysis region 102 between the first fluid actuation device 108 and the second fluid actuation device 110. In one example, the sensor 112 is centered within the microchannel analysis region 112 between the first fluid actuation device 108 and the second fluid actuation device 110. The sensor 112 measures the impedance of a fluid (e.g., a water based fluid carrying cells) within the microchannel analysis region.

The sensor 112 may be arranged at any suitable location or locations within microchannel analysis region 102, such as on the bottom surface of the microchannel analysis region 102, on the top surface of the microchannel analysis region 102 opposite to the bottom surface, on a first side surface of the microchannel analysis region 102, and/or on a second side surface of the microchannel analysis region 102 opposite to the first side surface.

Controller 114 is electrically coupled to the first fluid actuation device 108 and the second fluid actuation device 110 through a signal path 116 and to sensor 112 through a signal path 118. Controller 114 may include a central processing unit (CPU), a microcontroller, an application-specific integrated circuit (ASIC), or other suitable logic circuitry for controlling cell analyzer 100 and for processing the impedance measurements received from sensor 112. As described in more detail below with reference to FIGS. 2A-2B, controller 114 activates the first fluid actuation device 108 to generate a first pressure wave in the fluid and activates the second fluid actuation device 110 to generate a second pressure wave in the fluid. The first pressure wave and the second pressure wave converge at the sensor 112 to deform a cell to be analyzed.

Cell analyzer 100 may obtain the deformation of the cell with a high data rate and may obtain the cell deformation versus time. This deformation information may then be used in real time to sort the cells based on their deformability. The oscillation of a cell due to a pulse pressure perturbation may also be observed. This information allows complex cell elasticity (e.g., visco-elastic behavior of the cell) to be obtained. The same cell may be interrogated with varying pressure intensity to obtain the non-linear stress-strain behavior of the cell.

Figure 2A:
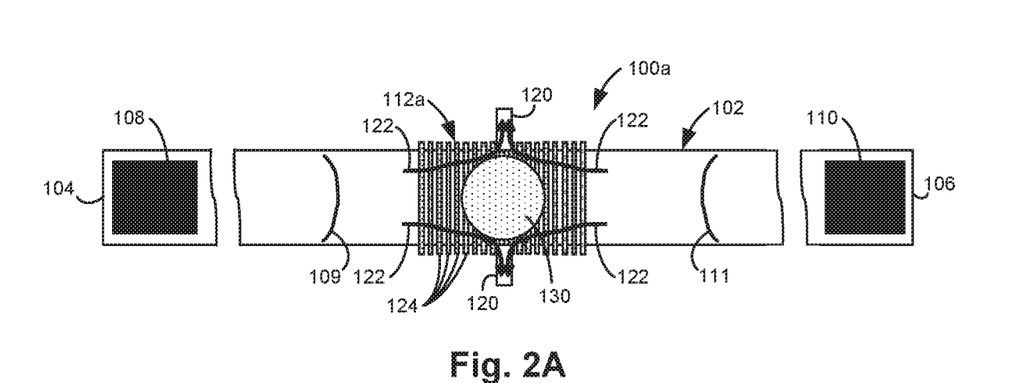
Figure 2B:
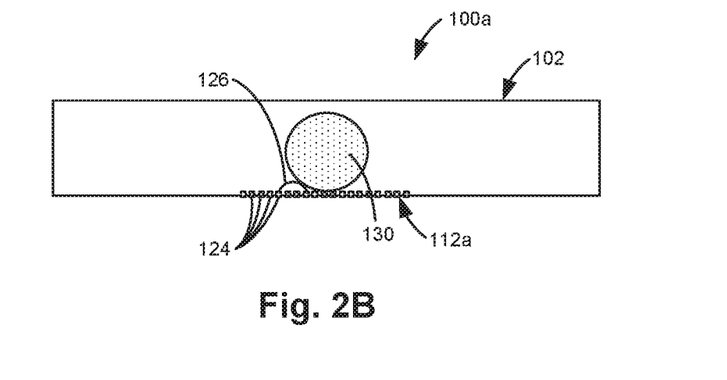

FIG. 2A illustrates a top view and FIG. 2B illustrates a side view of one example of a cell analyzer 100a in operation. Cell analyzer 100a is similar to cell analyzer 100 previously described and illustrated with reference to FIG. 1, except that cell analyzer 100a includes fluid channels 120 and a sensor 112a is used in place of sensor 112. Fluid channels 120 are coupled to opposing sides of microchannel analysis region 102 at the center of microchannel analysis region 102. Sensor 112a includes an array of electrodes 124. In this example, the array of electrodes 124 are arranged in parallel lines.

Microchannel analysis region 102 receives a cell 130 to be analyzed. The controller 114 (FIG. 1) activates the first fluid actuation device 108 and the second fluid actuation device 110 in response to the sensor 112a detecting the cell 130 in proximately to the sensor 112a such that a first pressure wave 109 and a second pressure wave 111 deform the cell 130. Cell 130 may be detected by sensor 112a by detecting a change in the impedance of the fluid in the microchannel analysis region 102. As will be described in more detail below with reference to FIG. 5, the impedance is measured between different pairs of electrodes 124 of sensor 112a. For example, as shown in FIG. 2B, the impedance between two electrodes 124 of the sensor 112a may be measured for a current path 126 between the two electrodes 124. The first pressure wave 109 and the second pressure wave 111 converge at the sensor 112a to deform the cell 130 and such that the fluid flows into fluid channels 120 as indicated by arrows 122.

Figure 3A:
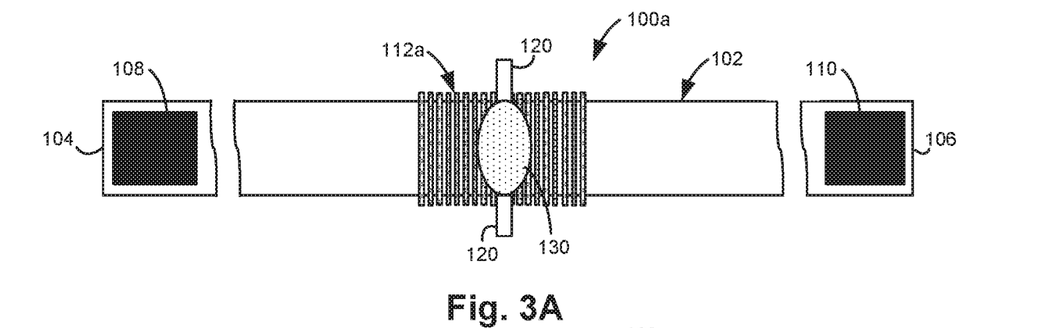
Figure 3B:
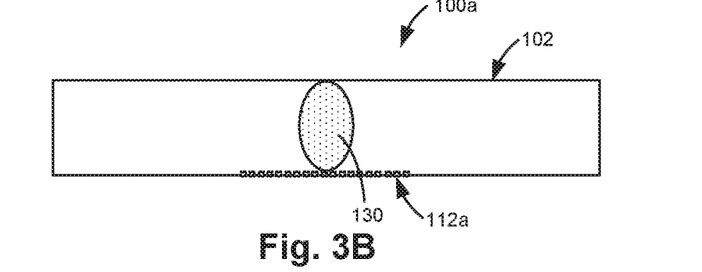

FIG. 3A is a top view and FIG. 3B is a side view of cell analyzer 100a after the first pressure wave 109 and the second pressure wave 111 impact the cell 130 from both sides. As shown in FIGS. 3A and 3B, cell 130 is deformed by the pressure waves. The deformation of cell 130 may be determined by measuring the impedance of the fluid within microchannel analysis region 102 via sensor 112a. In one example, a 20% deformation of the cell 130 results in a 36% change in an impedance between electrodes of sensor 112a. In other examples, deformations of the cell 130 result in other percentage changes in the impedance between electrodes of sensor 112a depending upon the particular cell being analyzed and the electrode configuration of sensor 112a.

Figure 4A:
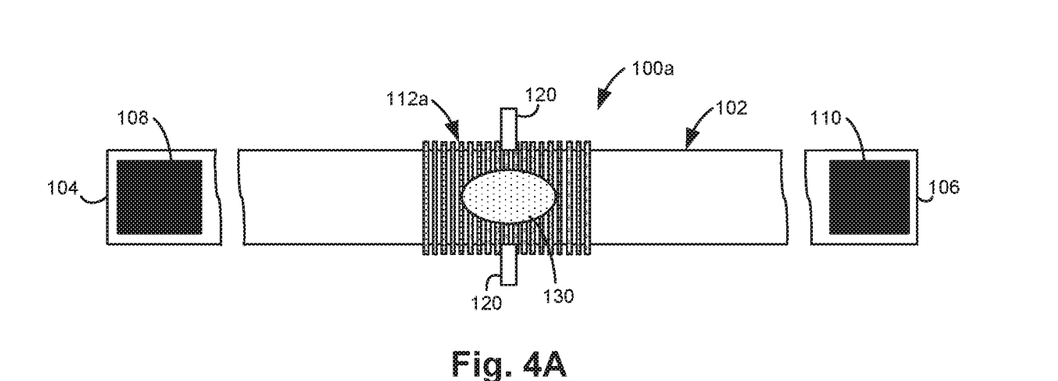
Figure 4B:
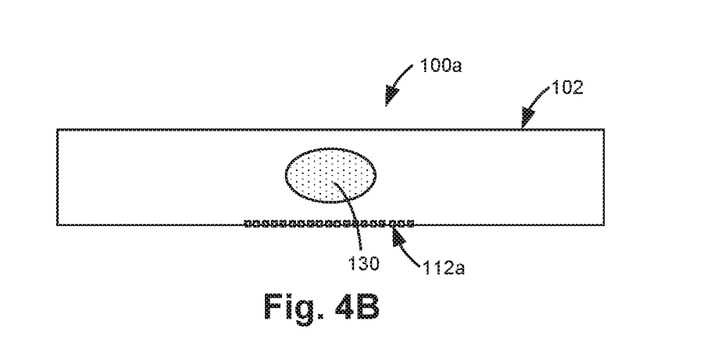

FIG. 4A is a top view and FIG. 4B is a side view of cell analyzer 100a illustrating the oscillation of cell 130 after the initial deformation of the cell illustrated in FIGS. 3A and 3B. The oscillation of cell 130 may be determined by measuring the impedance of the fluid within microchannel analysis region 102 over time via sensor 112a.

As a first order modeling, the cell 130 may be modeled as a viscous spherical drop with surface tension. The oscillations in a viscous spherical drop are given by:

$$\varepsilon = \varepsilon_0 \exp(i\sigma t)$$

where:
σ are the frequencies of oscillation, and
t is time.
For a viscous sphere with surface tension:

$$\sigma = (l-1)(l+2)\frac{\mu}{\rho R^2} \pm i\sqrt{l(l-1)(l+2)\frac{T}{\rho R^3}}$$

where:
μ is the drop viscosity (cytoplasm effective viscosity),
T is the surface tension (cell-medium effective surface tension),
ρ is the density,
R is the radius, and
l is an integer representing different modes.
Using data for liver cells:

$$T=23 \text{ N/m}, \mu=40 \text{ Pa*s}$$

and using:

$$\rho=1000 \text{ kg/m}^3, R=10 \text{ μm}$$

(as is typical for hepatocytes), frequencies can be expected on the order of 400 MHz (and higher harmonics) from the viscous component, and 5 MHz from the surface tension component. This indicates that by sampling the impedance at 50 MHz, the surface tension component of cell vibrations may be measured. With GHz sampling, the viscous vibration component of the cell may be measured as well.

Figure 5:
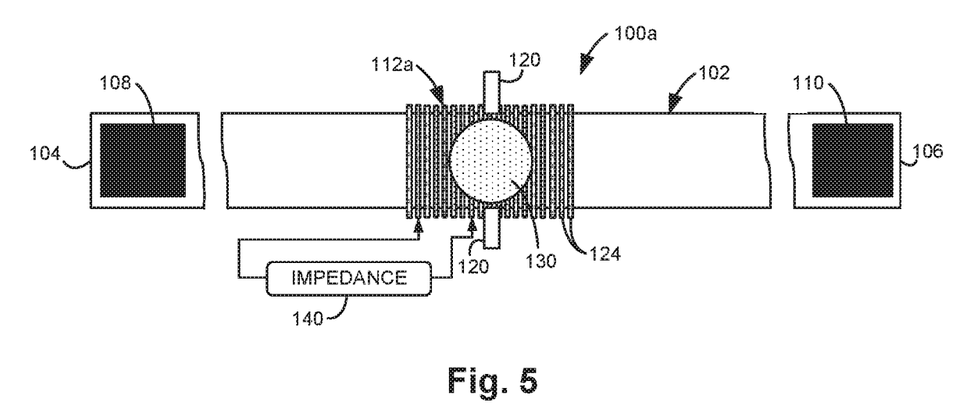
FIG. 5 illustrates one example of an impedance measurement for the cell analyzer of FIGS. 2A-4B.

FIG. 5 is a top view illustrating one example of an impedance measurement for the cell analyzer 100a of FIGS. 2A-4B. Cell analyzer 100a includes impedance measuring circuitry 140 to perform pairwise measurements. Impedance measuring circuitry 140 sequentially measures the impedance between different pairs of electrodes 124 of sensor 112a. The pairs of electrodes 124 may be directly adjacent to each other, separated from each other by other electrodes 124, or a combination thereof. In this way, the impedance between each unique pair of electrodes 124 of sensor 112a may be measured. The impedance measurements may be processed (e.g., by controller 114) to determine the deformation of cell 130.

Figure 6:
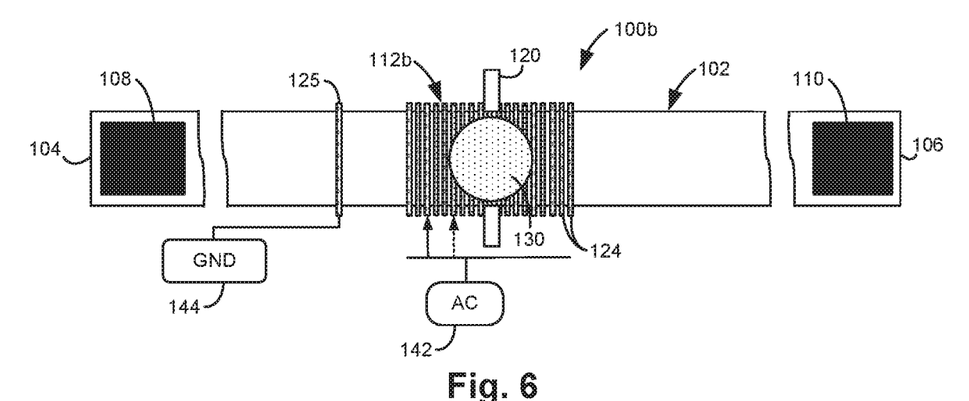
FIG. 6 illustrates another example of a cell analyzer.

FIG. 6 is a top view illustrating another example of a cell analyzer 100b. Cell analyzer 100b is similar to cell analyzer 100a previously described and illustrated with reference to FIG. 5, except that cell analyzer 100b includes a sensor 112b in place of sensor 112a. Sensor 112b include an array of electrodes 124 and a common electrode 125 spaced apart from the array of electrodes 124. In this example, the impedance of the fluid within microchannel analysis region 102 is measured between each electrode 124 of the array of electrodes 124 and the common electrode 125. For example, an AC voltage as indicated at 142 may be applied in sequence to each electrode 124 of the array of electrodes 124 while the common electrode 125 is grounded as indicated at 144 to measure the impedance.

Figure 7:
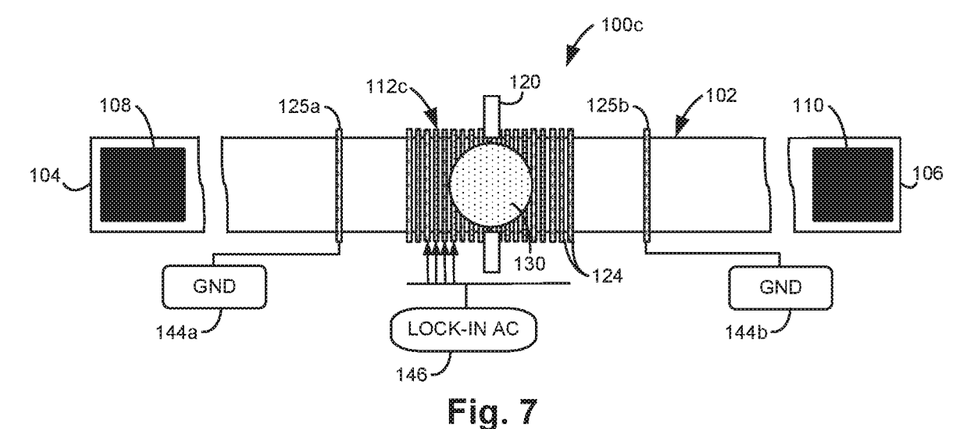
FIG. 7 illustrates another example of a cell analyzer.

FIG. 7 is a top view illustrating another example of a cell analyzer 100c. Cell analyzer 100c is similar to cell analyzer 100b previously described and illustrated with reference to FIG. 6, except that cell analyzer 100c includes a sensor 112c in place of sensor 112b. Sensor 112c includes an array of electrodes 124, a first common electrode 125a spaced apart from the array of electrodes 124 on a first side of the array of electrodes 124, and a second common electrode 125b spaced apart from the array of electrodes 124 on a second side of the array of electrodes 124 opposite to the first side. In this example, the impedance of the fluid within microchannel analysis region 102 is simultaneously measured between electrodes 124 and first common electrode 125a and/or second common electrode 125b using a plurality of lock-in amplifiers. For example, AC voltages at different frequencies may be applied simultaneously to each electrode 124 as indicated at 146 while the common electrodes 125a and 125b are grounded as indicated at 144a and 144b, respectively, to simultaneously measure the impedances.

Figure 8:
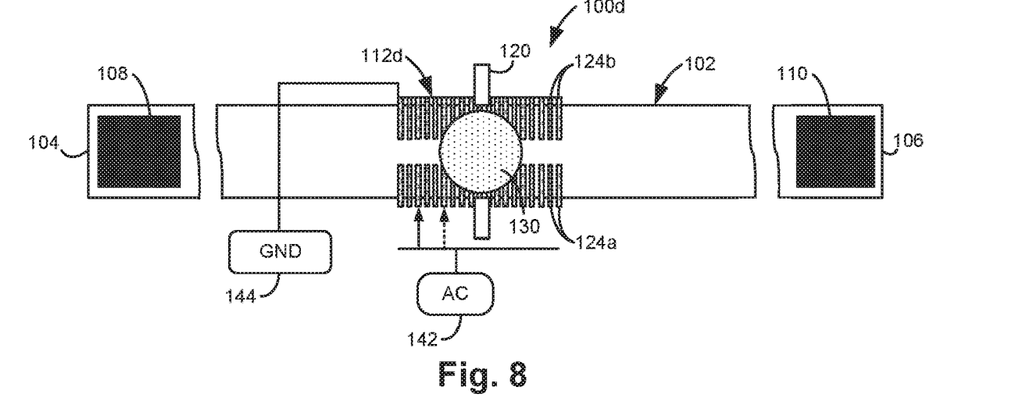
FIG. 8 illustrates another example of a cell analyzer.

FIG. 8 is a top view illustrating another example of a cell analyzer 100d. Cell analyzer 100d is similar to cell analyzer 100b previously described and illustrated with reference to FIG. 6, except that cell analyzer 100d includes a sensor 112d in place of sensor 112b. Sensor 112d includes a first array of electrodes 124a on a first side of the microchannel analysis region 102 and a second array of electrodes 124b on a second side of the microchannel analysis region 102 opposite to the first array of electrodes 124a. In this example, the impedance of the fluid within microchannel analysis region 102 is measured between each electrode 124a of the first array of electrodes 124a and a corresponding electrode 124b of the second array of electrodes 124b. For example, an AC voltage as indicated at 142 may be applied in sequence to each electrode 124a of the first array of electrodes 124a while each electrode 124b of the second array of electrodes 124b is grounded as indicated at 144 to measure the impedance.

Figure 9:
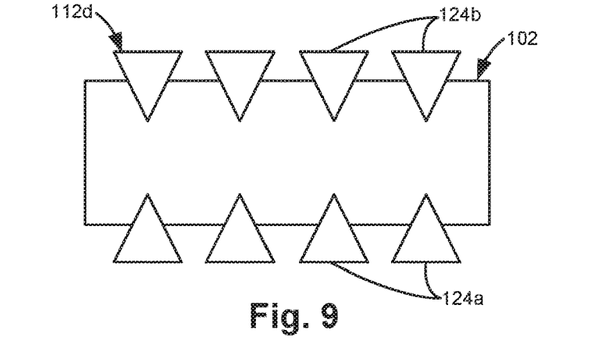
FIG. 9 illustrates one example of additional detail for the sensor of the cell analyzer of FIG. 8.

FIG. 9 illustrates one example of additional detail for sensor 112d of the cell analyzer 100d of FIG. 8. As shown in FIG. 9, each electrode 124a of the first array of electrodes 124a and each electrode 124b of the second array of electrodes 124b may have a wedge shape. The wedge shape may improve the capability of sensor 112d in capturing changes in the impedance between the electrodes 124a and 124b. In other examples, each electrode 124a and 124b may have a line shape, a butterfly shape, or another suitable shape.

Figure 10A:
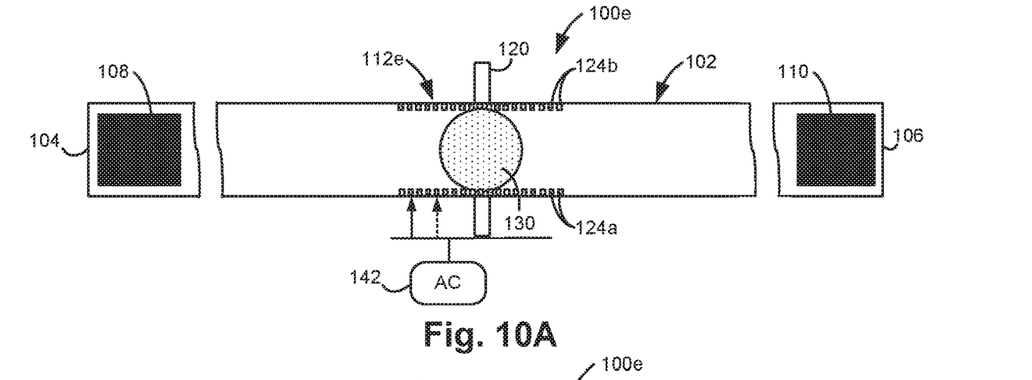
FIGS. 10A-10B illustrate another example of a cell analyzer.
Figure 10B:
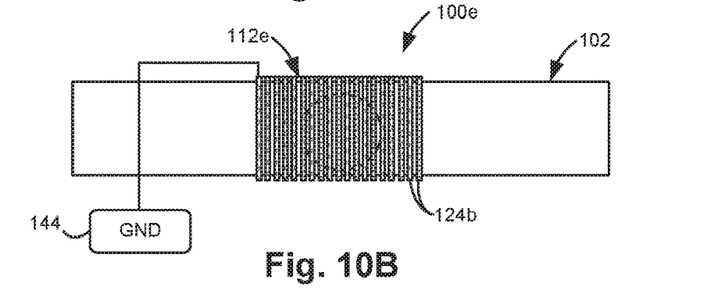

FIG. 10A is a top view and FIG. 10B is a side view illustrating another example of a cell analyzer 100e. Cell analyzer 100e is similar to cell analyzer 100d previously described and illustrated with reference to FIG. 8, except that cell analyzer 100e includes a sensor 112e in place of sensor 112d. Sensor 112e includes a first array of electrodes 124a on a first side of the microchannel analysis region 102 and a second array of electrodes 124b on a second side of the microchannel analysis region 102 opposite to the first array of electrodes 124a. As shown in FIG. 10B, each electrode 124a and 124b extends from the top of the microchannel analysis region 102 to the bottom of the microchannel analysis region 102. Each electrode 124a and 124b may have a shape as described above with reference to FIG. 9. In this example, the impedance of the fluid within microchannel analysis region 102 is measured between each electrode 124a of the first array of electrodes 124a and a corresponding electrode 124b of the second array of electrodes 124b. For example, an AC voltage as indicated at 142 may be applied in sequence to each electrode 124a of the first array of electrodes 124a while each electrode 124b of the second array of electrodes 124b is grounded as indicated at 144 to measure the impedance.

Figure 11A:
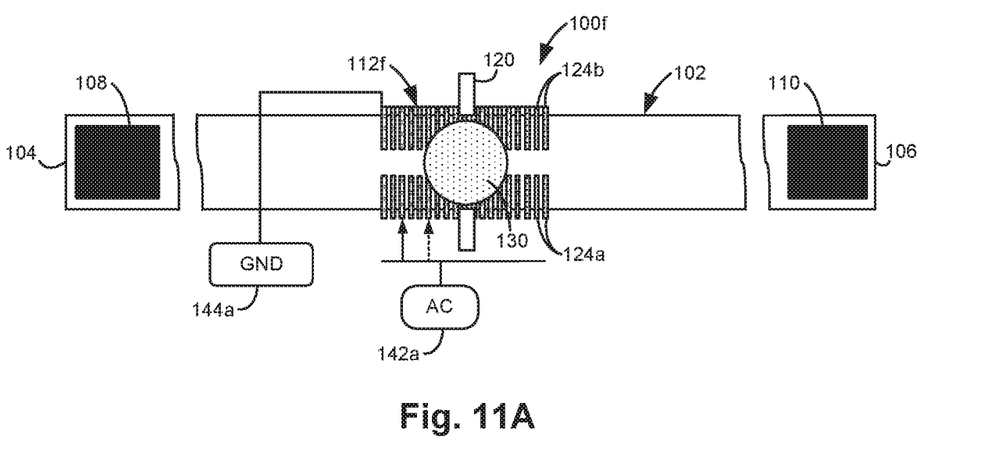
FIGS. 11A-11B illustrate another example of a cell analyzer.
Figure 11B:
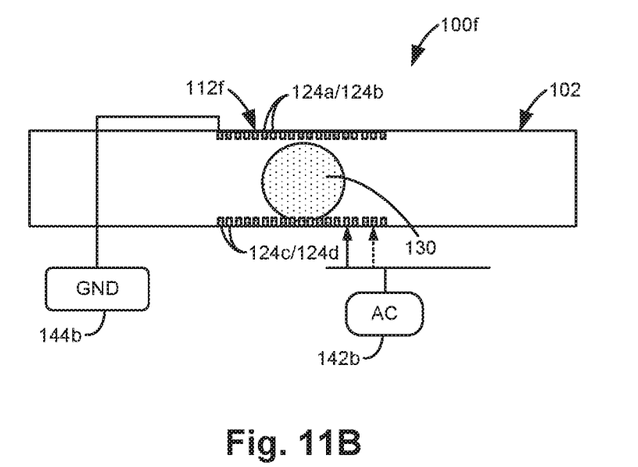

FIG. 11A is a top view and FIG. 11B is a side view illustrating another example of a cell analyzer 100f. Cell analyzer 100f is similar to cell analyzer 100d previously described and illustrated with reference to FIG. 8, except that cell analyzer 100f includes a sensor 112f in place of sensor 112d. Sensor 112f is a quadrupole sensor including four arrays of electrodes. Sensor 112f includes a first array of electrodes 124a on a first side of the microchannel analysis region 102 and a second array of electrodes 124b on a second side of the microchannel analysis region 102 opposite to the first array of electrodes 124a on a top side of the microchannel analysis region 102. In addition, sensor 112f includes a third array of electrodes 124c on the first side of the microchannel analysis region 102 and a fourth array of electrodes 124d on the second side of the microchannel analysis region 102 opposite to the third array of electrodes 124c on a bottom side of the microchannel analysis region 102 opposite to the top side. Each electrode 124a, 124b, 124c, and 124d may have a shape as described above with reference to FIG. 9.

In this example, the impedance of the fluid within microchannel analysis region 102 is measured between each electrode 124a of the first array of electrodes 124a and a corresponding electrode 124b of the second array of electrodes 124b. For example, an AC voltage as indicated at 142a may be applied in sequence to each electrode 124a of the first array of electrodes 124a while each electrode 124b of the second array of electrodes 124b is grounded as indicated at 144a to measure the impedance. In addition, the impedance of the fluid within microchannel analysis region 102 is measured between each electrode 124c of the third array of electrodes 124c and a corresponding electrode 124d of the fourth array of electrodes 124d. For example, an AC voltage as indicated at 142b may be applied in sequence to each electrode 124c of the third array of electrodes 124c while each electrode 124d of the fourth array of electrodes 124d is grounded as indicated at 144b to measure the impedance.

Figure 12:
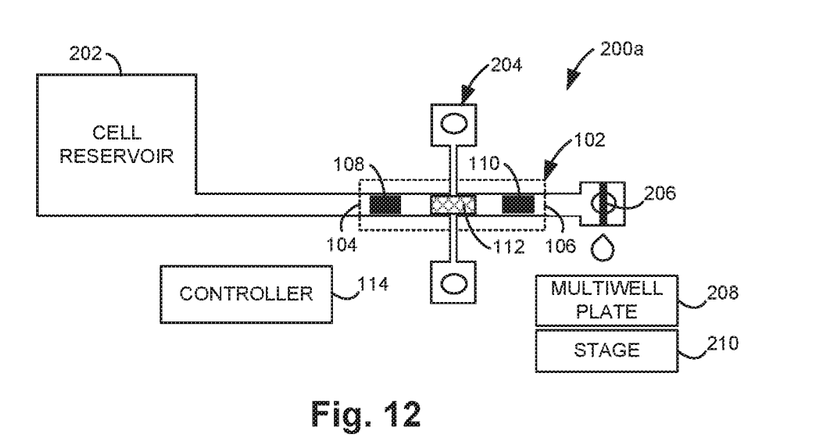
FIG. 12 illustrates one example of a system including a cell analyzer.

FIG. 12 illustrates one example of a system 200a including a cell analyzer. System 200a includes a cell reservoir 202, a microchannel analysis region 102, a first fluid actuation device 108, a second fluid actuation device 110, a sensor 112, a damping region 204, a controller 114, a drop ejector 206, a multiwell plate 208, and a movable stage 210. The microchannel analysis region 102 receives a cell within a fluid from the cell reservoir 202. As previously described above, first fluid actuation device 108 is at the first end 104 of the microchannel analysis region 102. Second fluid actuation device 110 is at the second end 106 of the microchannel analysis region 102 opposite to the first end 104. Sensor 112 is within the microchannel analysis region 102 between the first fluid actuation device 108 and the second fluid actuation device 110. Sensor 112 measures the impedance of the fluid within the microchannel analysis region 102 to analyze the cell.

Damping region 204 is coupled to the microchannel analysis region 102. Damping region 204 absorbs and dampens the fluid flow from microchannel analysis region 102 when the first pressure wave and the second pressure wave are generated by first fluid actuation device 108 and second fluid actuation device 110. Drop ejector 206 is coupled to the second end 106 of the microchannel analysis region 102. Drop ejector 206 is activated to selectively eject fluid drops (which may contain a cell analyzed in microchannel analysis region 102) to multiwell plate 208. Multiwell plate 208 is coupled to movable stage 210 to receive cells ejected by the drop ejector 206 based on the analysis of the cell. Movable stage 210 is controlled to position multiwell plate 208 relative to drop ejector 206. Controller 114 controls the first fluid actuation device 108, the second fluid actuation device 110, the sensor 112, the drop ejector 206, and the movable stage 210.

Figure 13:
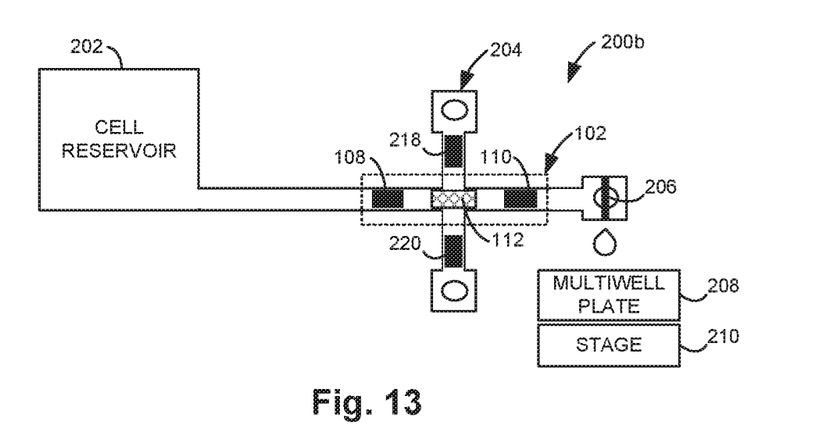
FIG. 13 illustrates another example of a system including a cell analyzer.

FIG. 13 illustrates another example of a system 200b including a cell analyzer. System 200b is similar to system 200a previously described and illustrated with reference to FIG. 12, except that system 200b includes a third fluid actuation device 218 and a fourth fluid actuation device 220. In this example, damping region 204 includes the third fluid actuation device 218 on a first side of the microchannel analysis region 102 and the fourth fluid actuation device 220 on a second side of the microchannel analysis region 102 opposite to the first side. In this case, controller 114 (FIG. 12) activates the third fluid actuation device 218 to generate a third pressure wave in the fluid and activates the fourth fluid actuation device 220 to generate a fourth pressure wave in the fluid. The third pressure wave and the fourth pressure wave converge at the sensor 112 to deform the cell in the microchannel analysis region 102.

Figure 14:
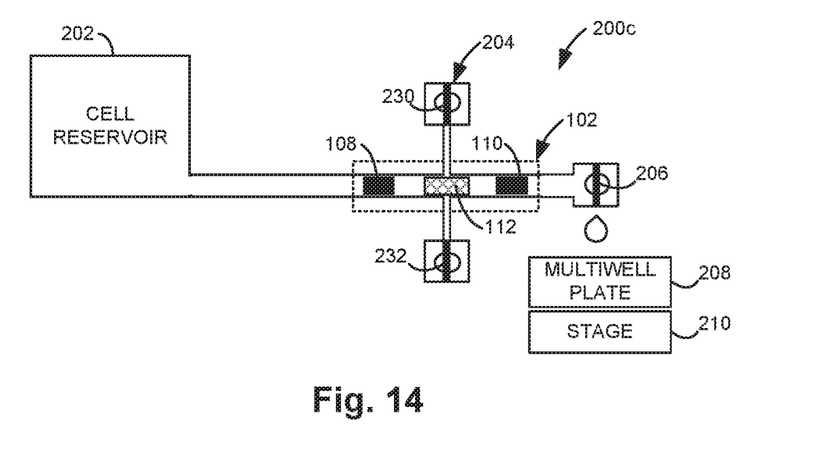
FIG. 14 illustrates another example of a system including a cell analyzer.

FIG. 14 illustrates another example of a system 200*c* including a cell analyzer. System 200*c* is similar to system 200*a* previously described and illustrated with reference to FIG. 12, except that system 200*c* includes additional drop ejectors 230 and 232. In this example, damping region 204 includes the drop ejector 230 on a first side of the microchannel analysis region 102 and the second drop ejector 232 on a second side of the microchannel analysis region 102 opposite to the first side. Each drop ejector 230 and 232 may be activated to selectively eject fluid drops. Controller 114 (FIG. 12) may control the drop ejectors 230 and 232.

Figure 15:
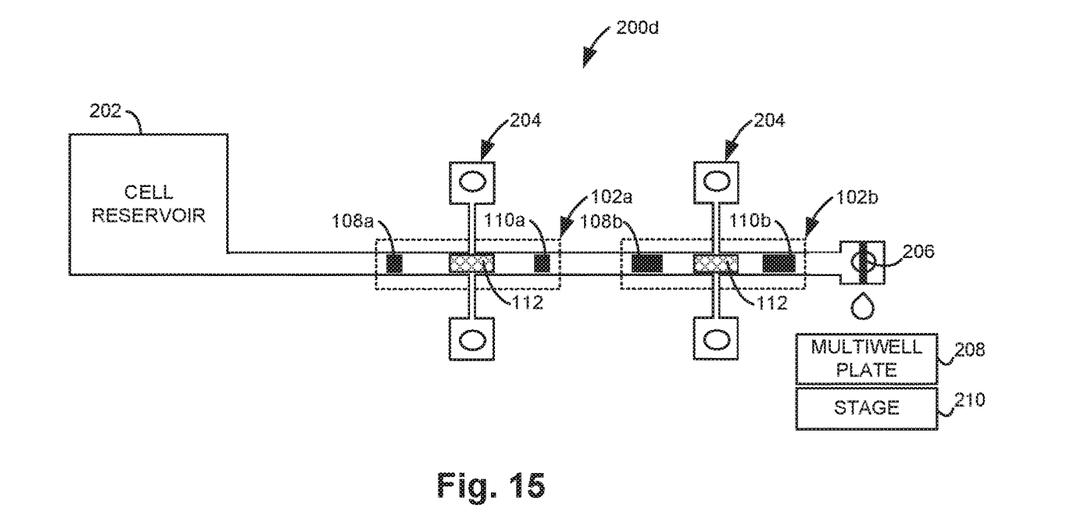
FIG. 15 illustrates another example of a system including a cell analyzer.

FIG. 15 illustrates another example of a system 200*d* including a cell analyzer. System 200*d* is similar to system 200*a* previously described and illustrated with reference to FIG. 12, except that system 200*d* includes two microchannel analysis regions 102*a* and 102*b*. Microchannel analysis region 102*a* includes fluid actuation devices 108*a* and 110*a* and a sensor 112. Microchannel analysis region 102*b* includes fluid actuation devices 108*b* and 110*b* and a sensor 112. In this example, fluid actuation devices 108*b* and 110*b* may be larger than fluid actuation devices 108*a* and 110*a*, respectively, such that an increasing shear stress may be applied to the cell as the cell is moved through microchannel analysis regions 102*a* and 102*b*. Controller 114 (FIG. 12) may control the first fluid actuation devices 108*a* and 108*b* and the second fluid actuation devices 110*a* and 110*b*.

Figure 16:
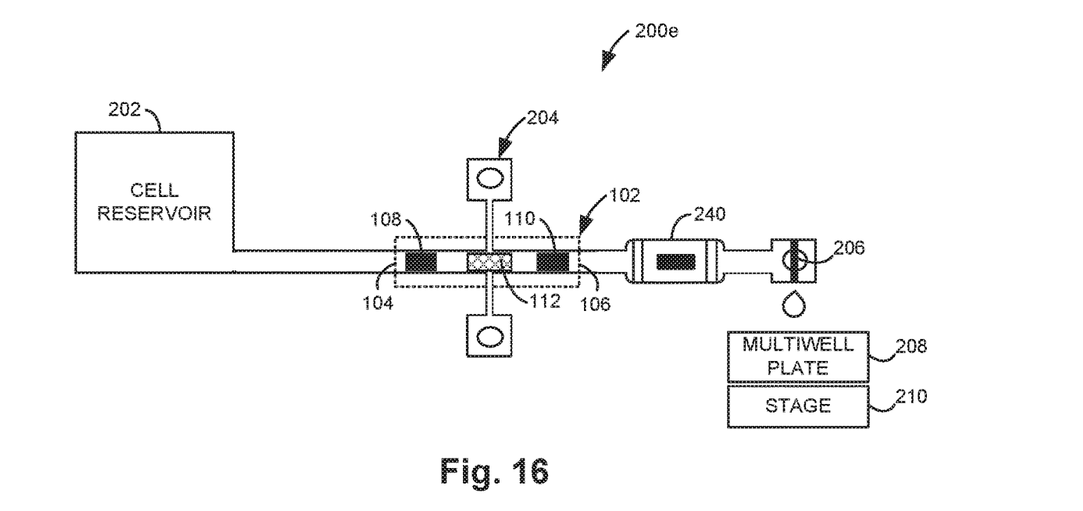
FIG. 16 illustrates another example of a system including a cell analyzer.

FIG. 16 illustrates another example of a system 200*e* including a cell analyzer. System 200*e* is similar to system 200*a* previously described and illustrated with reference to FIG. 12, except that system 200*e* includes a lysis chamber 240. Lysis chamber 240 is coupled to the second end 106 of the microchannel analysis region 102. Lysis chamber 240 may be used to destroy the cell membrane of the cell after the cell is analyzed in the microchannel analysis region 102. Controller 114 (FIG. 12) may control the lysis chamber 240.

Figure 17:
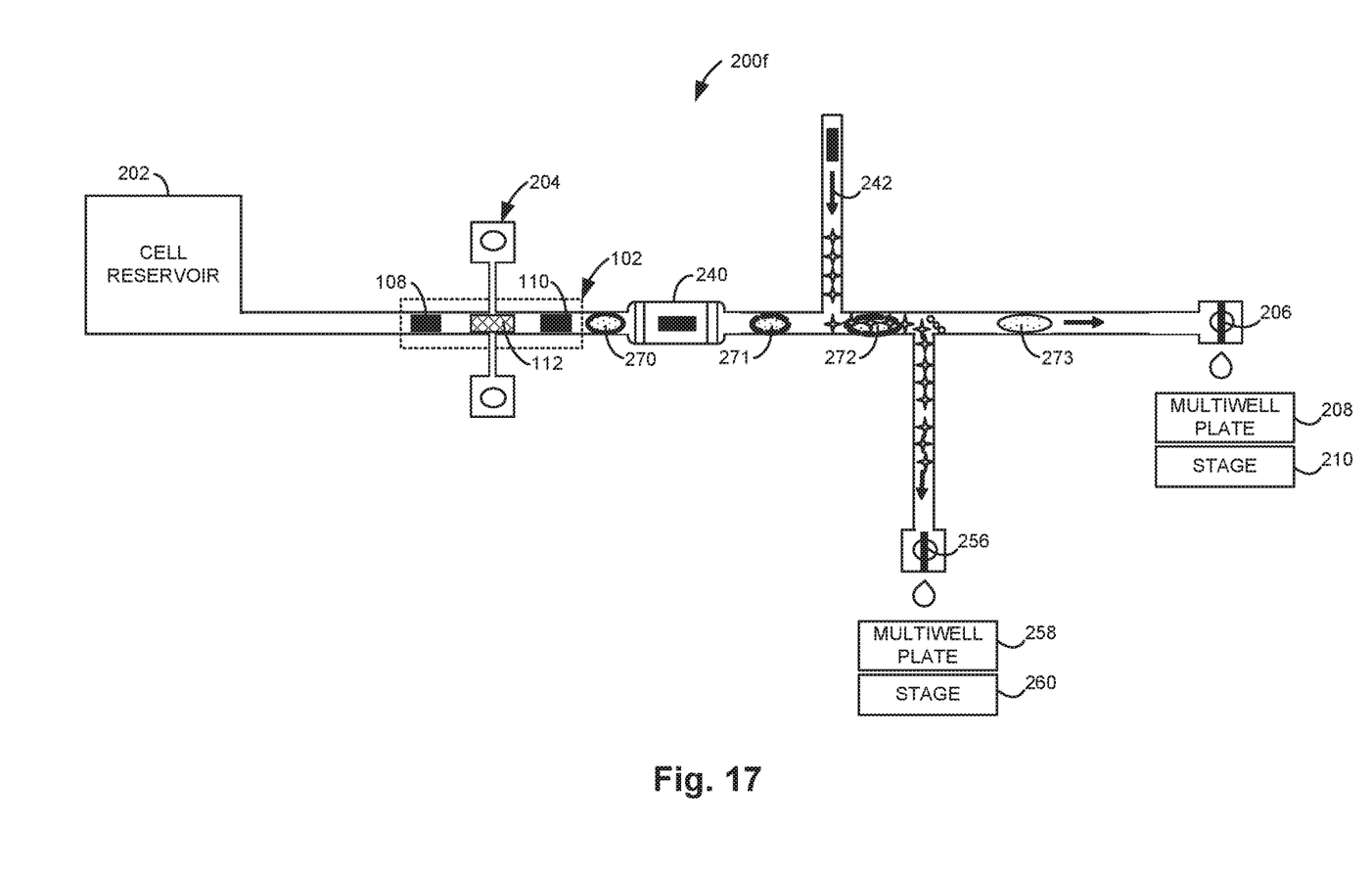
FIG. 17 illustrates one example of a system including a cell analyzer and a sorter.

FIG. 17 illustrates another example of a system 200*f* including a cell analyzer and a sorter. System 200*f* is similar to system 200*e* previously described and illustrated with reference to FIG. 16, except that system 200*f* includes a silica bead stream as indicated at 242, an additional drop ejector 256, an additional multiwell plate 258, and an additional movable stage 260. In this example, a cell 270 that has been analyzed in microchannel analysis region 102 has its cell membrane destroyed in lysis chamber 240 as indicated by cell 271. Silica beads from silica bead stream 242 bind to the nucleic acid (NA) of the cell as indicated at 272. The silica beads with the NA are ejected by drop ejector 256 to multiwell plate 258. Movable stage 260 is controlled to position multiwell plate 258 relative to drop ejector 256. The proteins and other cell components indicated at 273 are ejected by drop ejector 206 to multiwell plate 208. Controller 114 (FIG. 12) may control the silica bead stream 242, the drop ejector 256, and the movable stage 260.

Figure 18:
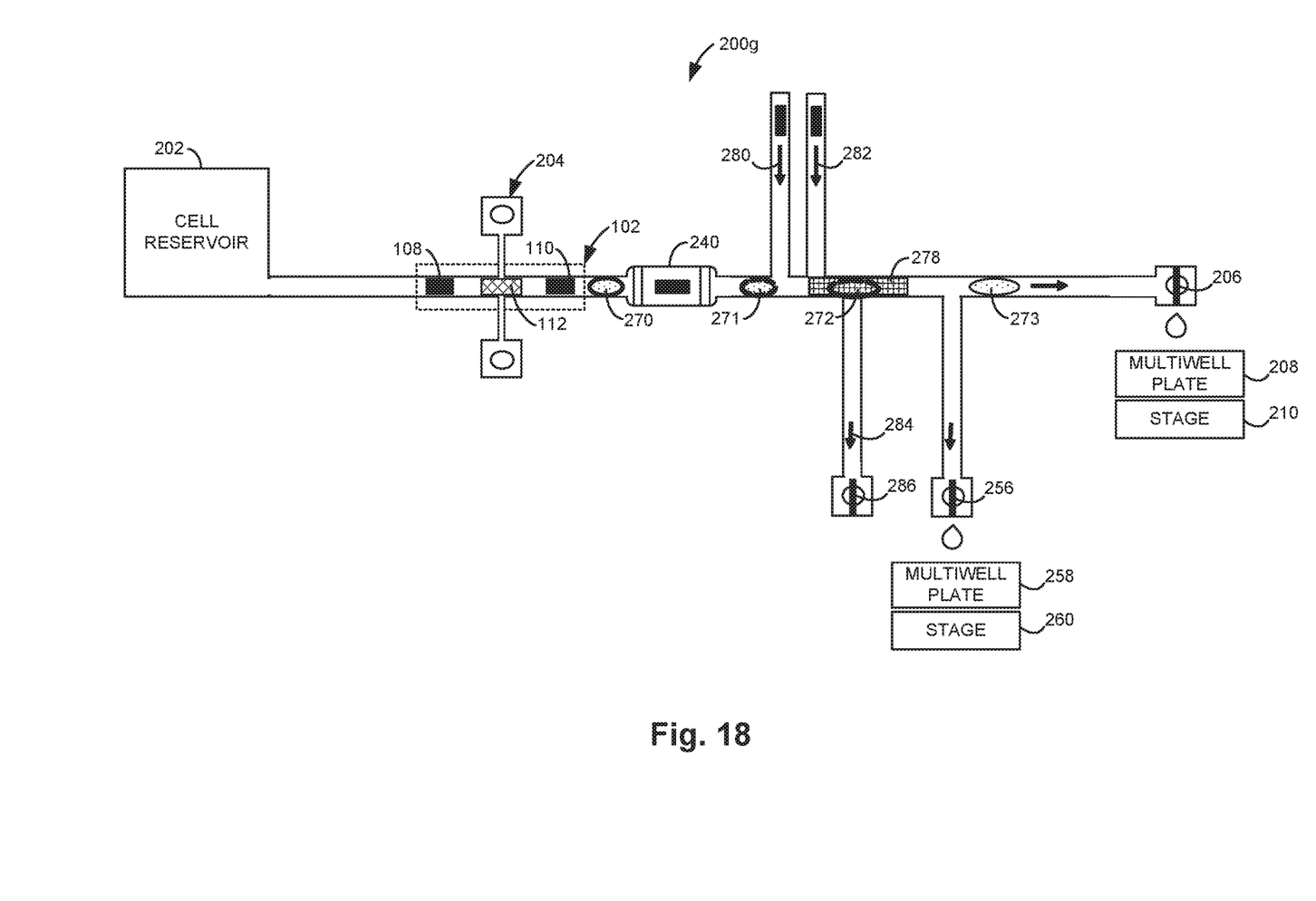
FIG. 18 illustrates another example of a system including a cell analyzer and a sorter.

FIG. 18 illustrates another example of a system 200*g* including a cell analyzer and a sorter. System 200*g* is similar to system 200*f* previously described and illustrated with reference to FIG. 17, except that system 200*g* includes a silica column 278, an elution buffer stream 280, a wash stream 282, a waste stream 284, and an additional drop ejector 286. In this example, a cell 270 that has been analyzed in microchannel analysis region 102 has its cell membrane destroyed in lysis chamber 240 as indicated by cell 271. An elution buffer stream 280 and a wash stream 282 are applied to the cell indicated at 272 at silica column 278. The NA of the cell binds to the silica column. The waste in waste stream 284 is ejected by drop ejector 286. The eluted NA is ejected by drop ejector 256 to multiwell plate 258. The proteins and other cell components indicated at 273 are ejected by drop ejector 206 to multiwell plate 208. Controller 114 (FIG. 12) may control the elution buffer stream 280, the wash stream 282, and the drop ejector 286.

Figure 19:
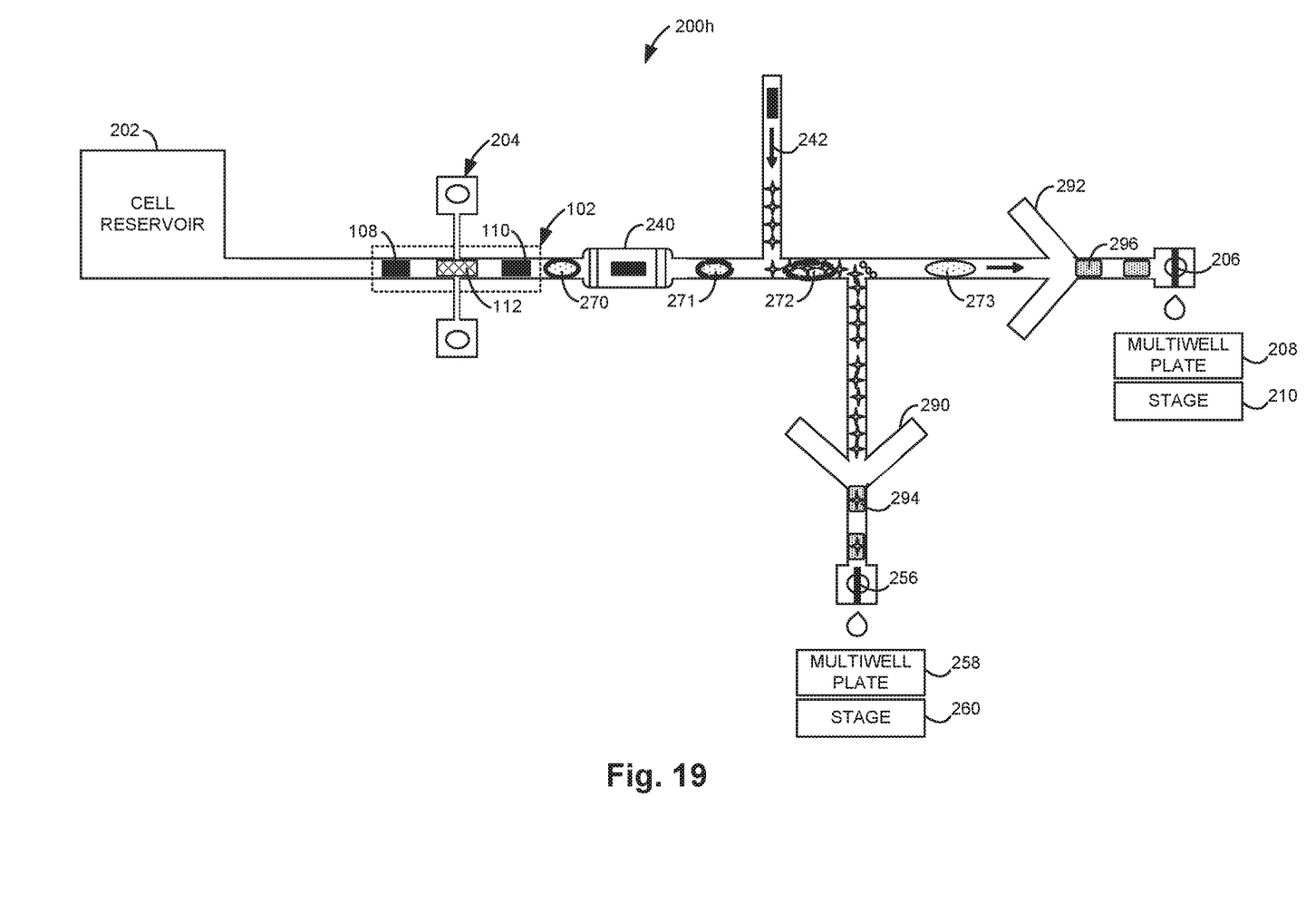
FIG. 19 illustrates another example of a system including a cell analyzer and a sorter.

FIG. 19 illustrates another example of a system 200*h* including a cell analyzer and a sorter. System 200*h* is similar to system 200*f* previously described and illustrated with reference to FIG. 17, except that system 200*h* includes encapsulators 290 and 292. In this example, the silica beads coated with NA are encapsulated with an encapsulating oil at 290. The encapsulated silica beads with NA, as indicated at 294, are ejected by drop ejector 256 to multiwell plate 258. The proteins and other cell components indicated at 273 are encapsulated with an encapsulating oil at 292. The encapsulated proteins and other cell components, as indicated at 296, are ejected by drop ejector 206 to multiwell plate 208.

Figure 20A:
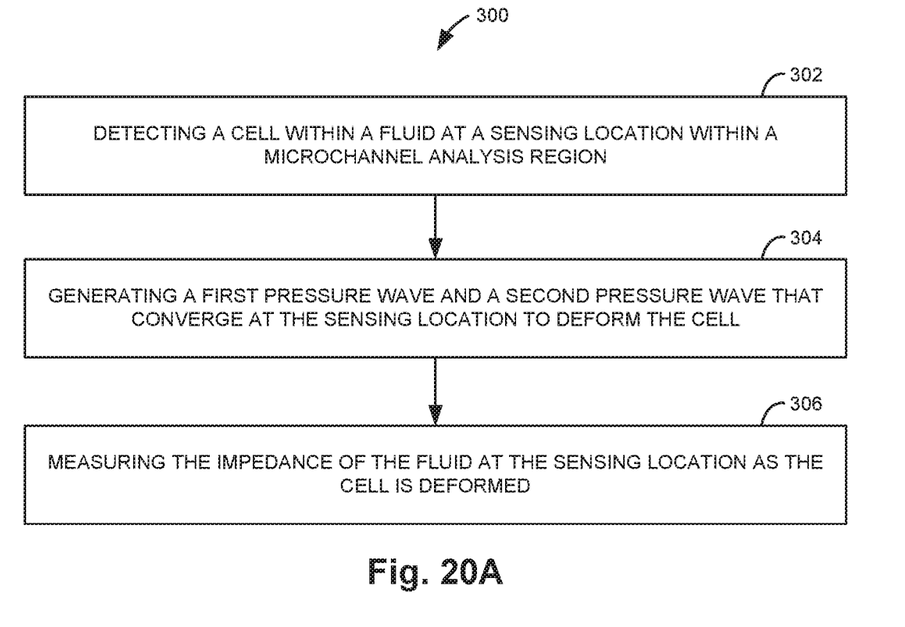
FIGS. 20A-20C are flow diagrams illustrating one example of a method for analyzing a cell.
Figure 20B:
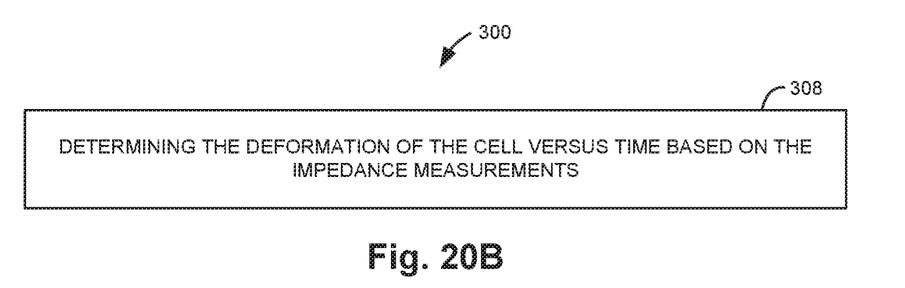
Figure 20C:
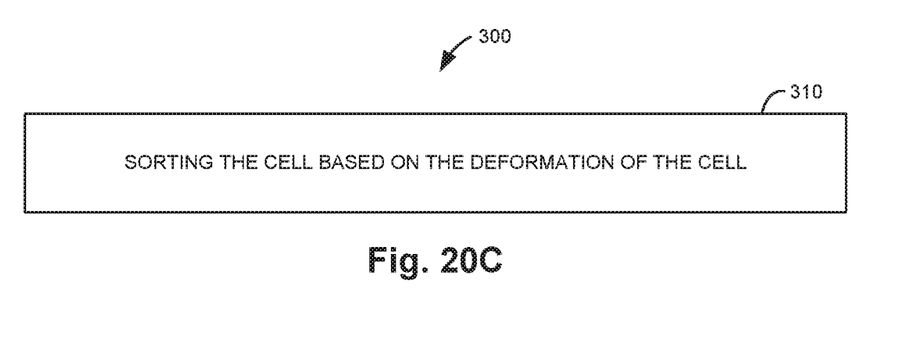

FIGS. 20A-20C are flow diagrams illustrating one example of a method 300 for analyzing a cell. In one example, method 300 may be implemented by a system 200*a*-200*h* as previously described and illustrated with reference to FIGS. 12-19, respectively. As illustrated in FIG. 20A at 302, method 300 includes detecting a cell within a fluid at a sensing location within a microchannel analysis region. At 304, method 300 includes generating a first pressure wave and a second pressure wave that converge at the sensing location to deform the cell. At 306, method 300 includes measuring the impedance of the fluid at the sensing location as the cell is deformed. As illustrated in FIG. 20B, at 308 method 300 may further include determining the deformation of the cell versus time based on the impedance measurements. As illustrated in FIG. 20C, at 310 method 300 may further include sorting the cell based on the deformation of the cell.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A system comprising:
   a microchannel analysis region;
   a first fluid actuation device at a first end of the microchannel analysis region and a second fluid actuation device at a second end of the microchannel analysis region opposite to the first end;
   a sensor within the microchannel analysis region between the first fluid actuation device and the second fluid actuation device, the sensor to measure an impedance of a fluid within the microchannel analysis region; and
   a controller to activate the first fluid actuation device to generate a first pressure wave in the fluid and to activate the second fluid actuation device to generate a second pressure wave in the fluid, the first pressure wave and the second pressure wave to converge at the sensor.

2. The system of claim 1, wherein the microchannel analysis region is to receive a cell to be analyzed, and wherein the controller is to activate the first fluid actuation device and the second fluid actuation in response to the sensor detecting a cell in proximately to the sensor such that the first pressure wave and the second pressure wave deform the cell.

3. The system of claim 1, wherein the sensor comprises a first array of electrodes.

4. The system of claim 3, wherein the sensor further comprises a common electrode such that the sensor is to measure the impedance of the fluid between each electrode of the first array of electrodes and the common electrode.

5. The system of claim 3, wherein the sensor further comprises a plurality of lock-in amplifiers such that the sensor is to simultaneously measure the impedance of the fluid between a corresponding plurality of pairs of electrodes of the first array of electrodes.

6. The system of claim 3, wherein the sensor further comprises a second array of electrodes opposite to the first array of electrodes, the sensor to measure the impedance of the fluid between each electrode of the first array of electrodes and a corresponding electrode of the second array of electrodes.

7. The system of claim 1, wherein the first fluid actuation device and the second fluid actuation device comprise a thermal inkjet resistor, a piezoelectric device, or a magnetostrictive element.

8. A system comprising:
a cell reservoir;
a microchannel analysis region to receive a cell within a fluid from the cell reservoir;
a first fluid actuation device at a first end of the microchannel analysis region and a second fluid actuation device at a second end of the microchannel analysis region opposite to the first end;
a sensor within the microchannel analysis region between the first fluid actuation device and the second fluid actuation device, the sensor to measure an impedance of the fluid within the microchannel analysis region to analyze the cell;
a damping region coupled to the microchannel analysis region; and
a controller to activate the first fluid actuation device to generate a first pressure wave in the fluid and to activate the second fluid actuation device to generate a second pressure wave in the fluid, the first pressure wave and the second pressure wave to converge at the sensor to deform the cell in the microchannel analysis region.

9. The system of claim 8, further comprising:
a drop ejector coupled to the second end of the microchannel analysis region; and
a multiwell plate coupled to a movable stage to receive cells ejected by the drop ejector based on the analysis of the cell.

10. The system of claim 8, wherein the damping region comprises a third fluid actuation device on a first side of the microchannel analysis region and a fourth fluid actuation device on a second side of the microchannel analysis region opposite to the first side, and
wherein the controller is to activate the third fluid actuation device to generate a third pressure wave in the fluid and to activate the fourth fluid actuation device to generate a fourth pressure wave in the fluid, the third pressure wave and the fourth pressure wave to converge at the sensor to deform the cell in the microchannel analysis region.

11. The system of claim 8, further comprising:
a lysis chamber coupled to the second end of the microchannel analysis region.

12. The system of claim 11, further comprising:
a sorter coupled to the lysis chamber to separate nucleic acid of the cell from other components of the cell.

13. A method for analyzing a cell, the method comprising:
detecting a cell within a fluid at a sensing location within a microchannel analysis region;
generating a first pressure wave and a second pressure wave that converge at the sensing location to deform the cell; and
measuring the impedance of the fluid at the sensing location as the cell is deformed.

14. The method of claim 13, further comprising:
determining the deformation of the cell versus time based on the impedance measurements.

15. The method of claim 14, further comprising:
sorting the cell based on the deformation of the cell.

* * * * *